United States Patent
Liu

(10) Patent No.: US 11,016,136 B2
(45) Date of Patent: May 25, 2021

(54) METHOD AND CONTROL SYSTEM FOR FAULT DIRECTION DETECTION

(71) Applicant: ABB Power Grids Switzerland AG, Baden (CH)

(72) Inventor: Kai Liu, Beijing (CN)

(73) Assignee: ABB Power Grids Switzerland AG, Baden (CH)

( * ) Notice: Subject to any disclaimer, the term of this patent is extended or adjusted under 35 U.S.C. 154(b) by 174 days.

(21) Appl. No.: 16/440,207

(22) Filed: Jun. 13, 2019

(65) Prior Publication Data

US 2019/0293704 A1    Sep. 26, 2019

Related U.S. Application Data

(63) Continuation of application No. PCT/CN2017/088417, filed on Jun. 15, 2017.

(51) Int. Cl.
*G01R 31/08* (2020.01)
*G01R 31/28* (2006.01)
(Continued)

(52) U.S. Cl.
CPC ....... *G01R 31/088* (2013.01); *G01R 31/2836* (2013.01); *G05B 9/02* (2013.01);
(Continued)

(58) Field of Classification Search
CPC .... G01R 31/088; G01R 31/2836; H02H 3/40; H02H 7/26; H02H 3/042; G05B 9/02
(Continued)

(56) References Cited

U.S. PATENT DOCUMENTS 6,584,417 B1    6/2003    Hu et al.
6,914,408 B2    7/2005    Sawada et al.
(Continued)

FOREIGN PATENT DOCUMENTS

CN    101701999 A    5/2010
CN    101839958 A    9/2010
(Continued)

OTHER PUBLICATIONS

State Intellectual Property Office of the P.R. China, International Search Report & Written Opinion issued in corresponding Application No. PCT/CN2017/088417, dated Mar. 15, 2018, 10 pp.
(Continued)

*Primary Examiner* — Giovanni Astacio-Oquendo
(74) *Attorney, Agent, or Firm* — Slater Matsil, LLP

(57) ABSTRACT

A method for detecting fault direction of transmission line of an AC power system and control system using the same. The method includes: sampling current values and voltage values of three phases at one end of the transmission line for a series of time points; for each of the series of time points, computing instantaneous symmetrical voltage components of the three phases based on the voltage value samples for the respective one of the series of time points; for each of the series of time points, computing instantaneous symmetrical current components of the three phases based on the current value samples for the respective one of the series of time points; for at least two of the series of time points, calculating energy directional elements each based on the respective ones of the computed instantaneous symmetrical voltage components and the respective ones of the computed instantaneous symmetrical current components; identifying the fault direction in consideration of the calculated energy directional elements; and generating a fault direction signal indicating the identified fault direction. Simulation results
(Continued)

show the graph of the energy directional element calculated based on instantaneous symmetrical voltage components and instantaneous symmetrical current components exhibits distinctive characteristics either for forward or reverse fault. In consideration of such difference, by calculating the energy directional element at each sampling time point, the fault direction information may be identified accurately.

20 Claims, 3 Drawing Sheets

(51) Int. Cl.
G05B 9/02 (2006.01)
H02H 3/04 (2006.01)
H02H 3/40 (2006.01)
H02H 7/26 (2006.01)
(52) U.S. Cl.
CPC .............. *H02H 3/042* (2013.01); *H02H 3/40* (2013.01); *H02H 7/26* (2013.01)
(58) Field of Classification Search
USPC ................................ 324/512, 509, 508, 500
See application file for complete search history.

(56) References Cited

U.S. PATENT DOCUMENTS

| | | | | |
|---|---|---|---|---|
| 2019/0072603 A1* | 3/2019 | Liu | ......................... | H02H 3/165 |
| 2019/0271730 A1* | 9/2019 | Liu | ......................... | G01R 31/50 |
| 2020/0400734 A1* | 12/2020 | Naidu | .................. | G01R 31/085 |

FOREIGN PATENT DOCUMENTS

| | | |
|---|---|---|
| CN | 103474980 A | 12/2013 |
| CN | 103762564 A | 4/2014 |
| WO | 2016044469 A1 | 3/2016 |

OTHER PUBLICATIONS

Blumschein et al., "Directional Comparison based on High-Speed-Distance Protection using Delta Quantities," Siemens AG, Infrastructure & Cities Sector, 7 pp.

Schweitzer, III et al., "Speed of Line Protection—Can We Break Free of Phasor Limitations?" Schweitzer Engineering Laboratories, Inc., 2014, 14 pp.

Benteng et al., "Principle and Property Research of the Energy Directional Protection," Proceedings of the CSEE, vol. 17, No. 3, May 1997, 5 pp.

\* cited by examiner

Forward fault

Reverse Fault

METHOD AND CONTROL SYSTEM FOR FAULT DIRECTION DETECTION

TECHNICAL FIELD

The invention relates to detecting faults in AC power system, and more particularly to fault direction detection in the AC power system.

BACKGROUND ART

AC power system has been widely deployed to supply, transfer, and use electric power. It may experience issues with stability during disturbances, such as short circuits, loss of generation, loss of load, open circuits, or any combination thereof. One of the solutions of these issues is to employ protection relays operating in high speed trigged assisted with fault direction signal.

Traditionally, fault direction may be detected based on local measurements of fault components at an end of the transmission line of the AC power system. An example of such fault direction detection mechanism is disclosed in "Principle and Property Research of the Energy Directional Protection", He Benteng, Jin Huafeng and Li Ju, Proceedings of the CSEE, Vol. 17 No. 3, May 1997.

However, under the condition of strong system where the power source approximates to an AC voltage source, the AC voltage is maintained at the end of the transmission line coupled to the power source even if a fault occurs with the AC power system. It turns out that a voltage fault component determined from the voltage measurement at the end of the transmission line may be insignificant for fault direction identification.

Therefore, the conventional solution suffers at least the disadvantage of poor sensitivity for detection of fault direction in strong AC power system. This may finally lead to fail to trip the circuit breaker in a faulted AC power system.

BRIEF SUMMARY OF THE INVENTION

According to one aspect of present invention, it provides a method for detecting fault direction of transmission line of an AC power system, including: sampling current values and voltage values of three phases at one end of the transmission line for a series of time points; for each of the series of time points, computing instantaneous symmetrical voltage components of the three phases based on the voltage value samples for the respective one of the series of time points; for each of the series of time points, computing instantaneous symmetrical current components of the three phases based on the current value samples for the respective one of the series of time points; for at least two of the series of time points, calculating energy directional elements each based on the respective ones of the computed instantaneous symmetrical voltage components and the respective ones of the computed instantaneous symmetrical current components; identifying the fault direction in consideration of the calculated energy directional elements; and generating a fault direction signal indicating the identified fault direction.

According to another aspect of present invention, it provides a control system for detecting fault direction of transmission line of an AC power system, including: a sampling circuit, being configured to sample current values and voltage values of three phases at one end of the transmission line for a series of time points; a controller, being configured to: for each of the series of time points, compute instantaneous symmetrical voltage components of the three phases based on the voltage value samples for the respective one of the series of time points; for each of the series of time points, compute instantaneous symmetrical current components of the three phases based on the current value samples for the respective one of the series of time points; a storage circuit, being configured to record the computed instantaneous symmetrical voltage components and the computed instantaneous symmetrical current components; wherein: the controller is further configured to: for at least two of the series of time points, calculate energy directional elements each based on the respective ones of the computed instantaneous symmetrical voltage components and the respective ones of the computed instantaneous symmetrical current components; identify the fault direction in consideration of the calculated energy directional elements; and generate a fault direction signal indicating the identified fault direction.

Simulation results show the graph of the energy directional element calculated based on instantaneous symmetrical voltage components and instantaneous symmetrical current components exhibits distinctive characteristics either for forward or reverse fault. In consideration of such difference, by calculating the energy directional element at each sampling time point, the fault direction information may be identified accurately.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
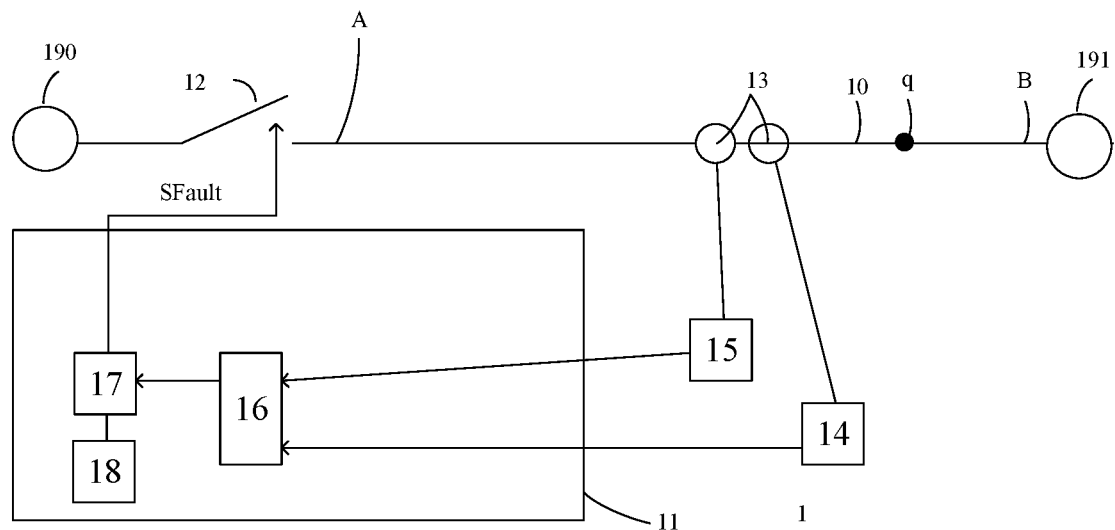
FIG. 1 shows an AC power system according to an embodiment of present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected". FIG. 1 shows an AC power system according to an embodiment of present invention. As shown in FIG. 1, the AC power system 1 includes a transmission line 10 defined at its two ends A and B. With respect to one of a first end A and a second end B of the transmission line 10, taking the first end A as an example, reverse fault is defined as of the fault occurring to a portion of the AC power system 1 to the opposite side of the transmission line 10; and forward fault is defined as of the fault occurring to a portion of the AC power system 1 at the same side with the transmission line 10. A protective relay 11, in the event of a fault, may disconnect the affected portion of the AC power system, for example by a power circuit breaker 12 where a forward fault is identified. A first AC source 190 is provided to be connected to the power circuit breaker 12 which further connects with the first end A of the transmission line 10.

Protective relay 11 is provided for this purpose at one of the first end A and the second end B at measurement points 13, for example at the first end A side. Electric signals, such as current and voltage signals of the three phases, appear at the measurement point 13 are transformed by current transformer 14 and voltage transformer 15 and are fed to the protective relay 11 and sampled by its sampling circuit 16.

The protective relay 11 samples the current and voltage signals by its sampling circuit 16 of an A/D conversion at a series of time points, and performs a fault direction identification, by its controller 17, for the current and voltage sampled values thus generated so as to be able to detect fault direction, either of forward to reverse. In the event of a forward fault, it may be single phase fault of short circuit between a phase and the ground, phase-phase fault of short circuit between any two phases, two phases to ground fault of short circuit between either of two phases and the ground, and three phase fault of short circuits among three phases.

If the protective relay 11 identifies a fault direction, for example by its controller 17, a forward fault signal $S_{fault}$ indicating the identified fault direction is thus generated by the controller 17, which is used to initiate tripping signal to the power circuit breaker 12 so as to allow said power circuit breaker to open its switching contacts and to disconnect the portion affected by the short circuit from the rest of the energy supply network.

The solutions explained hereinafter are used for fault direction identification using voltage fault component and current fault component at compensation point q on the transmission line 10 (as shown in FIG. 1) based on the current and voltage sampled values from the sampling circuit 16, which are established by the principle of time domain lumped parameter differential equation for the transmission line, which will therefore first be explained briefly hereinafter. The compensated point may be midpoint of the transmission line or other pre-set point. The time domain lumped parameter model may be for example an RLC model or an RL model. RLC model is used for an example illustrating the present invention hereinafter. Besides, the skilled person should understand that as an alternative, the solutions may directly use the voltage value samples and the current value samples provided by the sampling circuit 16.

The RLC model is one of the lumped parameter model and it is an example equivalent model used for the electrical line in the present invention. The RLC model comprises a resistor, an inductor and a capacitor. In other words, the whole transmission line can be represented by an equivalent circuit containing a resistor, an inductor and a capacitor. For illustrative purposes, reference is made to FIG. 2 to describe an example RLC model for a transmission line system.

Figure 2:
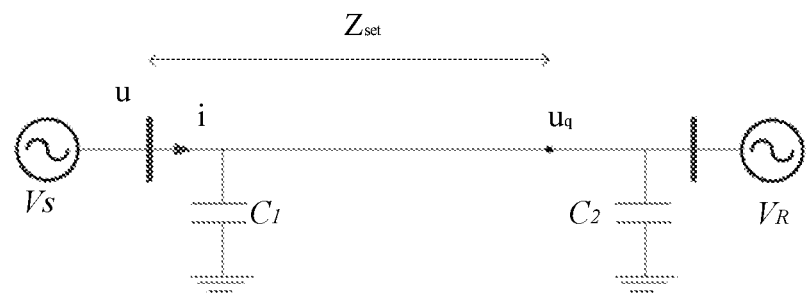
FIG. 2 shows an example RLC model for a transmission line system.

As illustrated in FIG. 2, the RLC model is a standard PI-type line model. The voltage at the start point is denoted by Vs and the voltage at the end point is denoted by $V_R$; the voltage and current at the measurement point are denoted by u and i respectively, the voltage at a setting point is denoted by $u_q$. The transmission line between the start point and the end point can be equivalent to a resistor and an inductor connected in series and two capacitors $C_1$ and $C_2$ which are respectively connected to the start point and the end point of the transmission line.

The impedance of the protection zone can be denoted by $Z_{set}$ in fundamental frequency domain $$Z_{set}=R+jX \quad (1)$$

Where $Z_{set}$ denotes the impedance of the protection zone, R denotes the resistance of the equivalent resistor of the transmission line and X denotes the inductance of the equivalent inductor of the transmission line. It shall be understood that although FIG. 2 illustrates the RLC model as a PI-type RLC model, the present invention is not limited thereto. The RLC model can also be any other forms of RLC model, a T-type RLC model, Tau-type RLC model, or some modified versions thereof. In addition, it may also use a further simplified RL model for the transmission line system. In some embodiments of the present invention, it can erase a capacitive current in a phase current. That is to say, after a phase current is obtained, at least one of a capacitive current to the ground and a capacitive current between phases can be removed from the obtained phase current.

Figure 3:
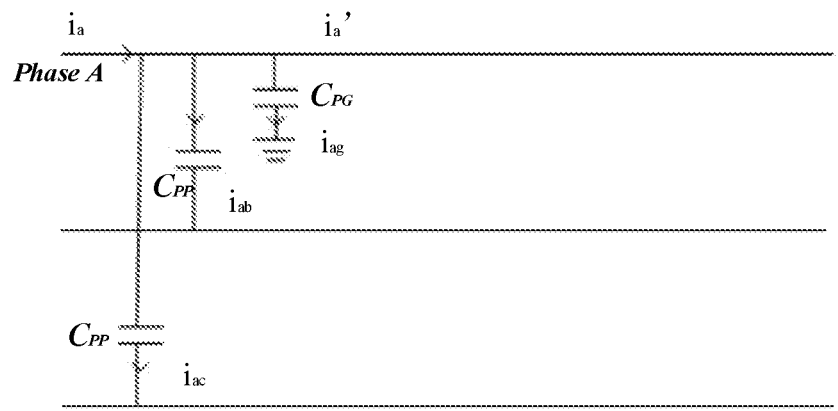
FIG. 3 schematically illustrates of a diagram of a capacitive current path for phase A according to an embodiment of the present invention.

For illustration purposes, FIG. 3 schematically illustrates of a diagram of a capacitive current path for phase A according to an embodiment of the present invention. As illustrated in FIG. 3, for phase A, there is a capacitance $C_{PG}$ of the line for phase A to the ground, a first capacitance $C_{PP}$ between the line for phase A and the line for phase B, and a second capacitance $C_{PP}$ between the line for phase A and the line for phase C. The capacitive currents related to capacitances $C_{PG}$, the first $C_{PP}$ and the second $C_{PP}$ are denoted by $i_{ag}$, $i_{ab}$, $i_{ac}$, respectively. The currents $i_{ag}$, $i_{ab}$, $i_{ac}$ can be obtained by following equations:

$$i_{ag} = C_{PG} \times \frac{du_a}{dt} \quad (2)$$

$$i_{ab} = C_{PP} \times \frac{du_{ab}}{dt} \quad (3)$$

$$i_{ac} = C_{PP} \times \frac{du_{ac}}{dt} \quad (4)$$

wherein $u_a$ represents the phase voltage of phase A; $u_{ab}$ represents a voltage difference between the phase voltage $u_a$ and a phase voltage $u_b$ i.e., $u_{ab}=u_a-u_b$; $u_{ac}$ represents a voltage difference between the phase voltage $u_a$ and a phase voltage $u_c$, i.e., $u_{ac}=u_a-u_c$. Thus, the current $i_a'$, which represents a current of phase A by removing the capacitive current impact can be determined based on the following equations.

$$i_a' = i_a - \left( C_{PG} \times \frac{du_a}{dt} + C_{PP} \times \frac{du_{ab}}{dt} + C_{PP} \times \frac{du_{ac}}{dt} \right) \quad (5)$$

Similarly, currents $i_b'$, $i_c'$ can represent phase currents by removing the capacitive current impact for phase B and phase C, respectively, and they can be determined as follows:

$$i_b' = i_b - \left(C_{PG} \times \frac{du_b}{dt} + C_{PP} \times \frac{du_{ba}}{dt} + C_{PP} \times \frac{du_{bc}}{dt}\right) \quad (6)$$

$$i_c' = i_c - \left(C_{PG} \times \frac{du_c}{dt} + C_{PP} \times \frac{du_{ca}}{dt} + C_{PP} \times \frac{du_{cb}}{dt}\right) \quad (7)$$

wherein $u_b$ represents the voltage of phase B; $u_c$ represents the voltage of phase C; $u_{ba}$ represents the voltage difference between the phase voltage $u_b$ and the phase voltage $u_a$, i.e., $u_{ba}=u_b-u_a$; $u_{ca}$ represents the voltage difference between the phase voltage $u_c$ and the phase voltage $u_a$, i.e., $u_{ca}=u_c-u_a$; $u_{bc}$ represents the voltage difference between the phase voltage $u_b$ and the phase voltage $u_c$, i.e., $u_{bc}=u_b-u_c$, $u_{cb}$ represents the voltage difference between the phase voltage $u_c$ and the phase voltage $u_b$, i.e., $u_{cb}=u_c-u_b$.

Figure 4:
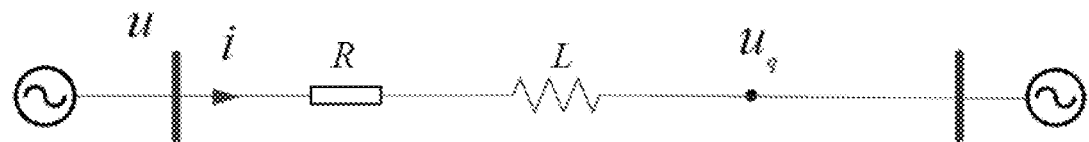
FIG. 4 schematically illustrates a single line diagram for the transmission line according to an embodiment of the present invention.

Thus, in embodiments of the present invention, it may use the current $i_a'$, $i_b'$, $i_c'$, which have subtracted the capacitive currents, instead of the original sampled currents $i_a$, $i_b$, $i_c$. If the capacitive currents are erased from the phase current, then the model of the transmission can be further reduced. For illustration purposes, FIG. 4 schematically illustrates a single line diagram for the transmission line according to an embodiment of the present invention. FIG. 4 is similar to that model as illustrated in FIG. 2, but resistor R and inductor L are illustrated in details and capacitors connected at the start point and the end point are removed since the capacitive currents are removed from the phase current.

Based on the single line diagram as illustrated in FIG. 4, the voltage at the setting point $u_q$ can be determined based on a differential equation such as:

$$u_q(t) = u(t) - R^* i(t) - L * \frac{di(t)}{dt} \quad (8)$$

wherein u(t) represents the voltage at the measurement point; i(t) represents the current at the measurement point, R represents a resistance value of a resistor in the lumped parameter model, and L represents an inductance value of an inductor in the lumped parameter model and di(t)/dt represents the differential value of the current i(t). If we consider the discrete time system domain, for example a sample point at time instant k, the following equation (8') can be used to represent the calculation in equation (8).

$$u_{q\_k} = u_k - \left(R \cdot i_k + L * \frac{di_k}{dt}\right) \quad (8')$$

wherein $u_{q\_k}$ represents the voltage at the setting point; $u_k$ represent the voltage at the measurement point; $i_k$ represents the current at the measurement point and L represents the inductance of inductor in the lumped parameter model (for example the RLC model); R represents the resistance of a resistor in the lumped parameter model (for example the RLC model); $di_k/dt$ represents the differential value of the current $i_k$ ($di_k$=ik−ik−1; dt=a sample interval for the given sampling rate; $i_{k-1}$ means the measured current at the time instant k−1 which is previous of time instant k in the discrete time domain)

Figure 5:
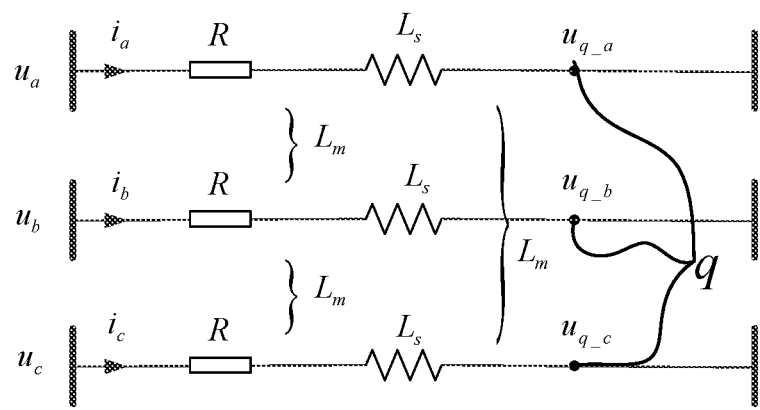
FIG. 5 shows three-phase transmission line diagram.

FIG. 5 shows three-phase transmission line diagram. As shown in FIG. 5, Ls is the phase inductance, Lm is the mutual inductance between phases, and k is the sampling time point. With the three-line diagram, it may determine voltages $u_{q\_a\_k}$, $u_{q\_b\_k}$ and $u_{q\_c\_k}$ based on equation (8) by further taking mutual inductance between phases into consideration. For example, voltage $u_{q\_a\_k}$, $u_{q\_b\_k}$ and $u_{q\_c\_k}$, can be determined based on the differential equation such as:

$$\begin{cases} u_{q\_a\_k} = u_{a\_k} - \left[R \cdot i_{a\_k} + L_s \cdot \frac{di_{a\_k}}{dt} + L_m \cdot \frac{di_{b\_k}}{dt} + L_m \cdot \frac{di_{c\_k}}{dt}\right] \\ u_{q\_b\_k} = u_{b\_k} - \left[R \cdot i_{b\_k} + L_s \cdot \frac{di_{b\_k}}{dt} + L_m \cdot \frac{di_{a\_k}}{dt} + L_m \cdot \frac{di_{c\_k}}{dt}\right] \\ u_{q\_c\_k} = u_{c\_k} - \left[R \cdot i_{c\_k} + L_s \cdot \frac{di_{c\_k}}{dt} + L_m \cdot \frac{di_{a\_k}}{dt} + L_m \cdot \frac{di_{b\_k}}{dt}\right] \end{cases} \quad (9)$$

wherein $u_{a\_k}$, $u_{b\_k}$ and $u_{c\_k}$ respectively represents line voltages for phase A, phase B and phase C at the measurement point; $i_{a\_k}$, $i_{b\_k}$ and $i_{c\_k}$ respectively represents currents for phase A, phase B and phase C at the measurement point; $L_s$ represents the phase inductance for phase A, phase B and phase C; and $L_m$ represents the inductance between phases for phase A, phase B and phase C. Since the phase to phase voltage is a voltage difference between one phase and another phase, thus the phase-to-phase voltages $u_{q\_ab\_k}$, $u_{q\_bc\_k}$ and $u_{q\_ca\_k}$ can be further determined based on the phase voltages $u_{q\_a\_k}$, $u_{q\_b\_k}$ and $u_{q\_c\_k}$ determined based on equation (9). For example, the voltage $u_{q\_ab\_k}$, i.e. the voltage between phase A and B at the setting point, can determined by:

$$u_{q\_ab\_k} = u_{q\_a\_k} - u_{q\_b\_k} \quad (10)$$

$$= u_{ab\_k} - \left[R \cdot i_{ab\_k} + (L_s - L_m) \cdot \frac{di_{ab\_k}}{dt}\right]$$

$$= u_{ab\_k} - \left[R \cdot i_{ab\_k} + L_m \cdot \frac{di_{ab\_k}}{dt}\right]$$

wherein $u_{ab\_k}$, $i_{ab\_k}$ respectively represent the voltage and current between phase A and phase B at the measurement point; R and L mean a positive sequence resistance and inductance for the phase line, L equals to the difference of Ls and Lm, i.e., $L=L_s-L_m$.

In equation (10), R and L are positive sequence resistance and inductance, $L=L_s-L_m$. Similarly, the voltages $u_{q\_bc\_k}$ and $u_{q\_ca\_k}$ can be computed too. According to the differential equation (10), the phase-to-phase voltages $u_{q\_ab\_k}$, $u_{q\_bc\_k}$ and $u_{q\_ca\_k}$ can be determined by the differential equation (11).

Equation (11) summarized the computation for these three phase-to-phase loop voltages, R and L in Equation (11) are positive sequence resistance and inductance:

$$\begin{cases} u_{q\_ab\_k} = u_{ab\_k} - \left(R \cdot i_{ab\_k} + L \cdot \frac{di_{ab\_k}}{dt}\right) \\ u_{q\_bc\_k} = u_{bc\_k} - \left(R \cdot i_{bc\_k} + L \cdot \frac{di_{bc\_k}}{dt}\right) \\ u_{q\_ca\_k} = u_{ca\_k} - \left(R \cdot i_{ca\_k} + L \cdot \frac{di_{ca\_k}}{dt}\right) \end{cases} \quad (11)$$

wherein $u_{ab\_k}$, $i_{ab\_k}$ respectively represents the voltage and current between phase A and phase B at the measurement point; $u_{bc\_k}$, $i_{bc\_k}$ respectively represent the voltage and current between phase B and phase C at the measurement point; $u_{ca\_k}$, $i_{ca\_k}$ respectively represent the voltage and current between phase C and phase A at the measurement point; R and L mean the positive sequence resistance and inductance for the phase line, L equals to the difference of $L_s$ and Lm, i.e., $L=L_s-L_m$. Thus, we can determine the phase voltage $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$. It shall be understood that although the phase voltages $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$ are described as to be determined based on equation (9) and (11) respectively, the present invention is not limited to these embodiments. In fact, it is possible to use any suitable form of differential equations.

For the phase-ground loop, voltages $u_{q\_a\_k}$, $u_{q\_b\_k}$ and $u_{q\_c\_k}$ at the compensation point q are computed by equation (9). Furthermore, these three voltages at the compensation point q can be computed by equation (12), R and L in Equation (12) are positive sequence resistance and inductance, the deduction process is not described here for the simplicity and clarity.

$$\begin{cases} u_{q\_a\_k} = u_{a\_k} - \left[R \cdot (i_{a\_k} + k_R \cdot 3i_{0\_k}) + L \cdot \frac{d(i_{a\_k} + k_L \cdot 3i_{0\_k})}{dt}\right] \\ u_{q\_b\_k} = u_{b\_k} - \left[R \cdot (i_{b\_k} + k_R \cdot 3i_{0\_k}) + L \cdot \frac{d(i_{b\_k} + k_L \cdot 3i_{0\_k})}{dt}\right] \\ u_{q\_c\_k} = u_{c\_k} - \left[R \cdot (i_{c\_k} + k_R \cdot 3i_{0\_k}) + L \cdot \frac{d(i_{c\_k} + k_L \cdot 3i_{0\_k})}{dt}\right] \\ k_R = \frac{R_0 - R_1}{3R_1} \quad k_L = \frac{L_0 - L_1}{3L_1} \end{cases} \quad (12)$$

wherein $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k; $K_R$ represents a factor determined based on $R_0$, $R_1$ as indicated in equation (12); $K_L$ represents a factor determined based on $L_0$, $L_1$ as indicated in equation (12).

Based on the principle of time domain lumped parameter differential equation for the transmission line, instantaneous voltage values at the compensation point q can be calculated from the sampling current values and voltage values at one end of the transmission line 10 for a series of time points, including three instantaneous voltage values $u_{q\_a\_k}$, $u_{q\_b\_k}$ and $u_{q\_c\_k}$ of phase-ground loop electric signals and three instantaneous voltage values $u_{q\_ab\_k}$, $u_{q\_bc\_k}$ and $u_{q\_ca\_k}$ of phase-phase loop electric signals. Namely, a mathematical link can be established based on the relations between the values of the sampled electric signals measured at the measurement point 13 and computed instantaneous voltage values at the compensation point q.

Voltage fault component of any of the six electrical loops at the compensation point q for sampling instant k can be computed from any of the equations (13-1) to (13-4) as below. The six electrical loop includes phase A to ground, phase B to ground, phase C to ground, phase A to phase B, phase B to phase C, and phase C to phase A.

$$\Delta u_{q\_k}=u_{q\_k}+u_{q\_k-N/2} \quad (13-1)$$

$$\Delta u_{q\_k}=[u_{q\_k}+u_{q\_k-N/2}]-[u_{q\_k-N}+u_{q\_k-3N/2}] \quad (13-2)$$

$$\Delta u_{q\_k}=u_{q\_k}-u_{q\_k-N} \quad (13-3)$$

$$\Delta u_{q\_k}=[u_{q\_k}-u_{q\_k-N}]-[u_{q\_k-N}-u_{q\_k-2N}] \quad (13-4)$$

wherein $\Delta u_{q\_k}$ indicates the voltage fault component of any of the six electrical loops at the compensation point q for sampling instant k, $u_{q\_k}$ indicates the voltage value of any of the six electrical loops at the compensation point q for sampling instant k, N indicates the number of sampling instant, preferably being equal to the number of sampling instant during the AC power system fundamental frequency cycle. In particular case such as for the electrical loop of phase A to ground, subscript "q_a" may be used in replacement of "q_" in equations (13-1) to (13-4), and symbol "$\Delta u_{q\_k}$" changes to "$\Delta u_{q\_a\_k}$". For the phase B to ground, phase C to ground, phase A to phase B, phase B to phase C, and phase C to phase A, "$\Delta u_{q\_b\_k}$", "$\Delta u_{q\_c\_k}$", "$\Delta u_{q\_ab\_k}$", "$\Delta u_{q\_bc\_k}$", "$\Delta u_{q\_ca\_k}$" would be used in the specific scenarios.

Similarly, current fault component of any of the six electrical loops at the compensation point q for sampling instant k can be computed from any of the equations (14-1) to (14-4) as below. The six electrical loop includes phase A to ground, phase B to ground, phase C to ground, phase A to phase B, phase B to phase C, and phase C to phase A.

$$\Delta i_{q\_k}=i_{q\_k}+i_{q\_k-N/2} \quad (14-1)$$

$$\Delta i_{q\_k}=[i_{q\_k}+i_{q\_k-N/2}]-[i_{q\_k-N}+i_{q\_k-3N/2}] \quad (14-2)$$

$$\Delta i_{q\_k}=i_{q\_k}-i_{q\_k-N} \quad (14-3)$$

$$\Delta i_{q\_k}=[i_{q\_k}-i_{q\_k-N}]-[i_{q\_k-N}-i_{q\_k-2N}] \quad (14-4)$$

wherein $\Delta i_{q\_k}$ indicates the current fault component of any of the six electrical loops at the compensation point q for sampling instant k, $i_{q\_k}$ indicates the current value of any of the six electrical loops at the compensation point q for the sampling instant k, N indicates the number of sampling instant, preferably being equal to the number of sampling instant during the AC power system fundamental frequency cycle. In particular case such as for the electrical loop of phase A to ground, subscript "q_a" may be used in replacement of "q_" in equations (14-1) to (14-4), and symbol "$\Delta i_{q\_k}$" changes to "$\Delta i_{q\_a\_k}$". For the phase B to ground, phase C to ground, phase A to phase B, phase B to phase C, and phase C to phase A, "$\Delta i_{q\_b\_k}$", "$\Delta i_{q\_c\_k}$", "$\Delta i_{q\_ab\_k}$", "$\Delta i_{q\_bc\_k}$", "$\Delta i_{q\_ca\_k}$" would be used in the specific scenarios.

EMBODIMENT I

Below are embodiments describing detection of fault direction of the transmission line by using the computed instantaneous voltage values of the three phases at compensated point q on the transmission line for the series of time points $u_{q\_a\_k}$, $u_{q\_b\_k}$, $u_{q\_c\_k}$ and the instantaneous current values of the three phases on the transmission line for the series of time points $i_{a\_k}$, $i_{b\_k}$, $i_{c\_k}$. The sampling circuit 16 is adapted for sampling current values $i_{a\_k}$, $i_{b\_k}$, $i_{c\_k}$ and voltage values $u_{a\_k}$, $u_{b\_k}$, $u_{c\_k}$ of three phases at one end A of the transmission line 10 for a series of time point.

In electrical engineering, an asymmetrical set of N phases can be expressed as a linear combination of N symmetrical sets of phasors by means of a complex linear transformation (see Hadjsaïd, Noureddine; Sabonnadière, Jean-Claude (2013). Power Systems and Restructuring, John Wiley & Sons. p. 244. ISBN 9781118599921). In the most common case of three-phase systems, the resulting "symmetrical" components are referred to as direct (or positive), inverse (or negative) and zero (or homopolar). As described above by referring to equations (1) to (15), the computed instantaneous voltage values of the three phases at compensated point q $u_{q\_a\_k}$, $u_{q\_b\_k}$, $u_{q\_c\_k}$ may be computed based on the voltage value samples $u_{a\_k}$, $u_{b\_k}$, $u_{c\_k}$ for the respective one of the series of time points. Therefore, for each of the series of time points, the controller 17 may compute instantaneous symmetrical voltage component based on the voltage value samples $u_{a\_k}$, $u_{b\_k}$, $u_{c\_k}$ for the respective one of the series of time points. In this embodiment, for example, zero sequence voltage component $u_{q\_0\_k}$ is used for symmetrical voltage component, which may be calculated from $u_{q\_0\_k} = (u_{q\_a\_k} + u_{q\_b\_k} + u_{q\_c\_k})/3$. Besides, for each of the series of time points, compute instantaneous symmetrical current components of the three phases based on the current value samples $i_{a\_k}$, $i_{b\_k}$, $i_{c\_k}$ for the respective one of the series of time points. In this embodiment, for example, zero sequence current component $i_{0\_k}$ is used for symmetrical current component, which may be calculated from $i_{0\_k} = i_{a\_k} + i_{b\_k} + i_{c\_k}$.

The storage circuit 18 may record the computed instantaneous symmetrical voltage components $u_{q\_0\_k}$ and the computed instantaneous symmetrical current components $i_{0\_k}$.

For at least two of the series of time points, the controller 17 may calculate energy directional elements each based on the respective ones of the computed instantaneous symmetrical voltage components and the respective ones of the computed instantaneous symmetrical current components. For example, the energy directional element may be represented by integral of $u_{q\_0\_k} \cdot i_{0\_k}$ with respect to the time interval of the series of time points, where k indicates a time point of the series of time points. For the series of time points $t_1, t_2, \ldots t_n$, the instantaneous symmetrical voltage components may be represented by $u_{q\_0\_1}, u_{q\_0\_2}, \ldots u_{q\_0\_n}$, an the instantaneous symmetrical current components may be represented by $i_{0\_1}, i_{0\_2}, \ldots, i_{0\_n}$.

In this embodiment, the energy directional element may be represented by the equation:

$$S_0 = \int_{t_1}^{t_k} u_{q\_0\_k} \times i_{0\_k} dt \tag{15}$$

Based on the outcome of the energy directional element, the controller 17 may identify the fault direction in consideration of the calculated energy directional element. In this embodiment, for example, a first predetermined $S_1$ value and a second predetermined value $S_2$ are set. And, the first predetermined value is set as negative; and the second predetermined value is set as positive.

The controller 17 may identify the fault direction as forward where the calculated energy directional elements is less than the first predetermined value $S_1$, and identify the fault direction as reverse where the calculated energy directional elements is greater than the second predetermined value $S_2$:

$$\begin{cases} S_0 > S_2 \text{ Reverse} \\ S_0 < S_1 \text{ Forward} \end{cases} \tag{16}$$

The absolute values of $S_1$, and $S_2$ serve as threshold for prevention of false judgement. For example, the absolute value of $S_1$ may be set at 0.1 times of a product of rated voltage and rated current values of power transmission line, and $S_2$ may be set at 0.05 times of a product of rated voltage and rated current values of power transmission line.

Otherwise, either of the first predetermined value and the second predetermined value may be set to be zero.

EMBODIMENT II

Different from the embodiment I, in the embodiment II of present invention, the detection of fault direction of the transmission line is performed by the sampling current values $i_{a\_k}$, $i_{b\_k}$, $i_{c\_k}$ and voltage values $u_{a\_k}$, $u_{b\_k}$, $u_{c\_k}$ of three phases at one end A of the transmission line 10 for a series of time point. Those samples may be provided by the sampling circuit 16.

For each of the series of time points, the controller 17 may compute instantaneous symmetrical voltage components of the three phases $u_{0\_k}$ directly from the voltage value samples $u_{a\_k}$, $u_{b\_k}$, $u_{c\_k}$ for the respective one of the series of time points. In this embodiment, for example, zero sequence voltage component $u_{0\_k}$ is used for symmetrical voltage component, which may be calculated from $u_{0\_k} = (u_{a\_k} + u_{b\_k} + u_{c\_k})/3$. Besides, for each of the series of time points, compute instantaneous symmetrical current components of the three phases based on the current value samples $i_{a\_k}$, $i_{b\_k}$, $i_{c\_k}$ for the respective one of the series of time points. In this embodiment, for example, zero sequence current component $i_{0\_k}$ is used for symmetrical current component, which may be calculated from $i_{0\_k} = i_{a\_k} + i_{b\_k} + i_{c\_k}$.

The storage circuit 18 may record the computed instantaneous symmetrical voltage components $u_{0\_k}$ and the computed instantaneous symmetrical current components $i_{0\_k}$.

For at least two of the series of time points, the controller 17 may calculate energy directional elements each based on the respective ones of the computed instantaneous symmetrical voltage components and the respective ones of the computed instantaneous symmetrical current components. For example, the energy directional element may be represented by integral of $u_{0\_k} \cdot i_{0\_k}$ with respect to the time interval of the series of time points, where k indicates a time point of the series of time points. For the series of time points $t_1, t_2, \ldots t_n$, the instantaneous symmetrical voltage components may be represented by $u_{q\_0\_1}, u_{q\_0\_2}, \ldots u_{q\_0\_n}$, an the instantaneous symmetrical current components may be represented by $i_{0\_1}, i_{0\_2}, \ldots, i_{0\_n}$.

In this embodiment, the energy directional element may be represented by the equation:

$$S_0 = \int_{t_1}^{t_k} u_{0\_k} \times i_{0\_k} dt \tag{17}$$

Based on the outcome of the energy directional element, the controller 17 may identify the fault direction in consideration of the calculated energy directional element. In this embodiment, for example, a first predetermined $S_1$ value and a second predetermined value $S_2$ are set. And, the first predetermined value is set as negative; and the second predetermined value is set as positive.

The controller 17 may identify the fault direction as forward where the calculated energy directional elements is less than the first predetermined value $S_1$, and identify the fault direction as reverse where the calculated energy directional elements is greater than the second predetermined value $S_2$:

$$\begin{cases} S_0 > S_2 & \text{Reverse} \\ S_0 < S_1 & \text{Forward} \end{cases} \quad (18)$$

The absolute values of $S_1$, and $S_2$ serve as threshold for prevention of false judgement. For example, the absolute values of $S_1$, and $S_2$ serve as threshold for prevention of false judgement. For example, the absolute value of $S_1$ may be set at 0.1 times of a product of rated voltage and rated current values of power transmission line, and $S_2$ may be set at 0.05 times of a product of rated voltage and rated current values of power transmission line.

Figure 6:
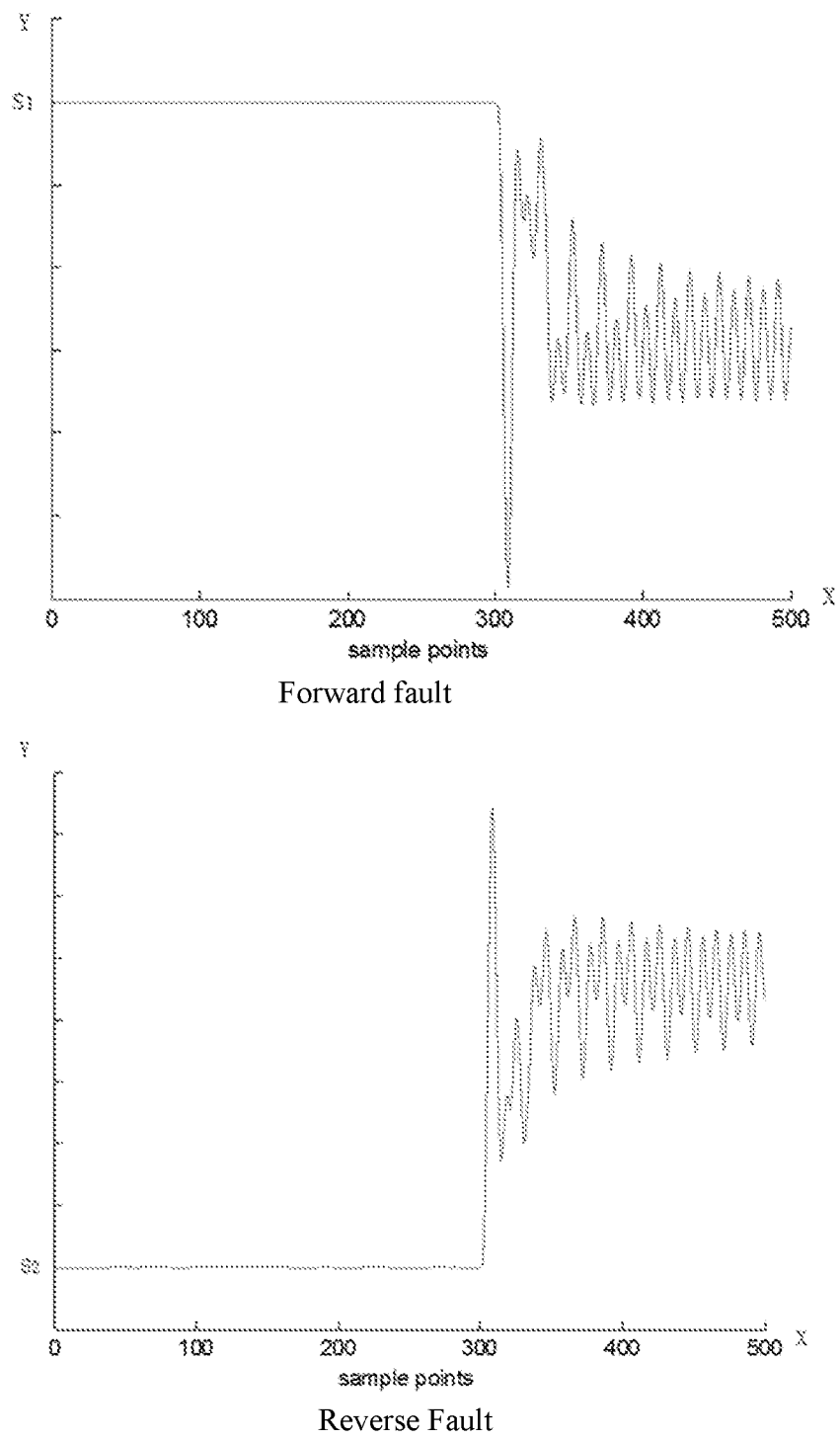
FIG. 6 shows simulation results of the energy directional element under forward fault condition and reverse fault condition according to an embodiment of present invention.

Otherwise, either of the first predetermined value and the second predetermined value may be set to be zero FIG. 6 shows simulation results of the energy directional element under forward fault condition and reverse fault condition according to an embodiment of present invention. The graph of FIG. 6 includes an x-axis indicative of time and a y-axis illustrating the energy directional element at each of the series of time points. For example, in this embodiment, the series of time points on the x-axis are represented in terms of the sampling time point starting from 0 to 500, where there are 500 sampling time points. The time interval for the integral of the energy directional element, for example, may be selected as covering consecutive 20 sampling time points starting from 20 sampling time points current sampling time point and ending at the current sampling current.

In a situation where a forward fault occurs at the sampling point of 300, as shown in FIG. 6, before that the energy directional element keeps substantially constant at the first predetermined value $S_1$. While, from the timing the forward fault occurring, the graph of the energy directional element oscillates below the first predetermined value $S_1$.

In a situation where a reverse fault occurs at the sampling point of 300, as shown in FIG. 6, before that the energy directional element keeps substantially constant at the second predetermined value $S_2$. While, from the timing the reverse fault occurring, the graph of the energy directional element oscillates above the second predetermined value $S_2$.

The simulation results show the graph of the energy directional element exhibits distinctive characteristics either for forward or reverse fault.

In consideration of such different locations of the energy directional elements with respect to the first and second predetermined values in case of a forward fault and a reverse fault, by on-line calculating the energy directional element at each sampling time point, the fault direction information may be identified accurately.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for detecting fault direction of transmission line of an AC power system, including:
sampling current values and voltage values of three phases at one end of the transmission line for a series of time points;
for each of the series of time points, computing instantaneous symmetrical voltage components of the three phases based on the voltage value samples for the respective one of the series of time points;
for each of the series of time points, computing instantaneous symmetrical current components of the three phases based on the current value samples for the respective one of the series of time points;
for at least two of the series of time points, calculating energy directional elements each based on the respective ones of the computed instantaneous symmetrical voltage components and the respective ones of the computed instantaneous symmetrical current components;
identifying the fault direction in consideration of the calculated energy directional elements; and
generating a fault direction signal indicating the identified fault direction.

2. The method according to claim 1, further including:
computing instantaneous voltage values of the three phases at compensated point on the transmission line from the current value samples and the voltage value samples based on a time domain lumped parameter differential equation for the transmission line for the series of time points; and
the computation of the instantaneous symmetrical voltage components is based on the computed instantaneous voltage values for the respective one of the series of time points.

3. The method according to claim 2, wherein:
the fault direction is identified as forward where the calculated energy directional elements is less than a first predetermined value; and
the fault direction is identified as reverse where the calculated energy directional elements is greater than a second predetermined value.

4. The method according to claim 3, wherein:
either of the first predetermined value and the second predetermined value equals to zero.

5. The method according to claim 3, wherein:
the first predetermined value is set as negative; and
the second predetermined value is set as positive.

6. The method according to claim 1, wherein:
the fault direction is identified as forward where the calculated energy directional elements is less than a first predetermined value; and
the fault direction is identified as reverse where the calculated energy directional elements is greater than a second predetermined value.

7. The method according to claim 6, wherein:
either of the first predetermined value and the second predetermined value equals to zero.

8. The method according to claim 6, wherein:
the first predetermined value is set as negative; and
the second predetermined value is set as positive.

9. The method according to claim 1, wherein:
the symmetrical voltage components refer to zero sequence voltage components of the three phases of the AC power system; and
the symmetrical current components refer to zero sequence current components of the three phases of the AC power system.

10. The method according to claim 1, wherein:
the symmetrical voltage components refer to negative sequence voltage components of the three phases of the AC power system; and the symmetrical current components refer to negative sequence current components of the three phases of the AC power system.

11. A control system for detecting fault direction of transmission line of an AC power system, including:
a sampling circuit, being configured to sample current values and voltage values of three phases at one end of the transmission line for a series of time points;
a controller, being configured to:
for each of the series of time points, compute instantaneous symmetrical voltage components of the three phases based on the voltage value samples for the respective one of the series of time points;
for each of the series of time points, compute instantaneous symmetrical current components of the three phases based on the current value samples for the respective one of the series of time points;
a storage circuit, being configured to record the computed instantaneous symmetrical voltage components and the computed instantaneous symmetrical current components;
wherein:
the controller is further configured to:
for at least two of the series of time points, calculate energy directional elements each based on the respective ones of the computed instantaneous symmetrical voltage components and the respective ones of the computed instantaneous symmetrical current components;
identify the fault direction in consideration of the calculated energy directional elements; and
generate a fault direction signal indicating the identified fault direction.

12. The control system according to claim 11, wherein:
the controller is further configured to:
compute instantaneous voltage values of the three phases at compensated point on the transmission line from the current value samples and the voltage value samples based on a time domain lumped parameter differential equation for the transmission line for the series of time points; and
the computation of the instantaneous symmetrical voltage components is based on the computed instantaneous voltage values for the respective one of the series of time points.

13. The control system according to claim 12, wherein:
the fault direction is identified as forward where the calculated energy directional elements is less than a first predetermined value; and
the fault direction is identified as reverse where the calculated energy directional elements is greater than a second predetermined value.

14. The control system according to claim 13, wherein:
either of the first predetermined value and the second predetermined value equals to zero.

15. The control system according to claim 13, wherein:
the first predetermined value is set as negative; and
the second predetermined value is set as positive.

16. The control system according to claim 11, wherein:
the fault direction is identified as forward where the calculated energy directional elements is less than a first predetermined value; and
the fault direction is identified as reverse where the calculated energy directional elements is greater than a second predetermined value.

17. The control system according to claim 16, wherein:
either of the first predetermined value and the second predetermined value equals to zero.

18. The control system according to claim 16, wherein:
the first predetermined value is set as negative; and
the second predetermined value is set as positive.

19. The control system according to claim 11, wherein:
the symmetrical voltage components refer to zero sequence voltage components of the three phases of the AC power system; and
the symmetrical current components refer to zero sequence current components of the three phases of the AC power system.

20. The control system according to claim 11, wherein:
the symmetrical voltage components refer to negative sequence voltage components of the three phases of the AC power system; and
the symmetrical current components refer to negative sequence current components of the three phases of the AC power system.

* * * * *